(12) United States Patent
Dimopoulou et al.

(10) Patent No.: US 10,917,109 B1
(45) Date of Patent: Feb. 9, 2021

(54) METHODS FOR STORING DIGITAL DATA AS, AND FOR TRANSFORMING DIGITAL DATA INTO, SYNTHETIC DNA

(71) Applicants: Centre National de la Recherche Scientifique, Paris (FR); Université Côte d'Azur, Nice (FR)

(72) Inventors: Melpomeni Panagiota Dimopoulou, Antibes (FR); Marc Antonini, Nice (FR)

(73) Assignees: Centre National de la Recherche Scientifique, Paris (FR); Université de la Côte d'Azur, Nice (FR)

( * ) Notice: Subject to any disclaimer, the term of this patent is extended or adjusted under 35 U.S.C. 154(b) by 0 days.

(21) Appl. No.: 16/811,985

(22) Filed: Mar. 6, 2020

(51) Int. Cl.
  *H03M 7/00* (2006.01)
  *H03M 7/30* (2006.01)
  *H03M 7/46* (2006.01)

(52) U.S. Cl.
  CPC ........... *H03M 7/3088* (2013.01); *H03M 7/46* (2013.01); *H03M 7/6011* (2013.01)

(58) Field of Classification Search
  CPC .... H03M 7/3088; H03M 7/46; H03M 7/6011; H03M 7/00
  USPC ...................................... 341/50, 51
  See application file for complete search history.

(56) References Cited

U.S. PATENT DOCUMENTS

| | | | | |
|---|---|---|---|---|
| 5,250,949 A * | 10/1993 | Frost | .................. | H03M 7/3082 341/200 |
| 5,608,397 A * | 3/1997 | Soljanin | .............. | H04L 25/4906 341/58 |
| 6,553,535 B1 * | 4/2003 | Asada | .................... | H03M 13/11 375/269 |
| 8,046,173 B2 * | 10/2011 | Evans | .................... | G16B 30/00 702/19 |
| 8,547,255 B2 * | 10/2013 | Multrus | .............. | H03M 7/3088 341/50 |
| 8,937,564 B2 * | 1/2015 | Aloni | ...................... | H03M 7/42 341/106 |
| 10,218,442 B2 * | 2/2019 | Amhoud | ............... | H04L 5/0023 |

(Continued)

OTHER PUBLICATIONS

Blawat et al., "Forward Error Correction for DNA Data Storage," Procedia Computer Science, vol. 80, (2016), pp. 1011-1022.

(Continued)

*Primary Examiner* — Jean B Jeanglaude
(74) *Attorney, Agent, or Firm* — TraskBritt (57) ABSTRACT

Methods for encoding data in synthetic DNA include, for an input data sequence, constructing a codebook of a number of unique codewords, of a nucleotide length, which are constructed such that, for each codeword, the codeword is formed from a selection of nucleotide pairs from a first predefined dictionary of nucleotide pairs, and, if the nucleotide length of the codeword is odd, an additional selection of a nucleotide from a second predefined dictionary of individual nucleotides. For each symbol from the input data sequence, at least one codeword is designated as associable therewith, and each symbol is coded as one codeword selected from the designated at least one codeword associable with that symbol. A code is formed from the codewords, arranged in corresponding order to that of their respective symbols in the input data sequence. A DNA sequence is synthetized with nucleotides ordered to match the code.

19 Claims, 4 Drawing Sheets

(56) References Cited

U.S. PATENT DOCUMENTS

| | | | |
|---|---|---|---|
| 2005/0273274 A1* | 12/2005 | Evans | G16B 30/00 702/20 |
| 2005/0282169 A1 | 12/2005 | Turner et al. | |
| 2008/0270439 A1* | 10/2008 | Evans | G16B 30/00 |
| 2014/0232574 A1* | 8/2014 | Aloni | H03M 7/42 341/106 |
| 2016/0333402 A1* | 11/2016 | Koller | C12Q 1/6874 |
| 2017/0331553 A1* | 11/2017 | Amhoud | H04B 10/2581 |
| 2018/0046921 A1* | 2/2018 | Chen | G11C 7/1006 |
| 2019/0362814 A1* | 11/2019 | Roquet | G06F 16/2272 |
| 2020/0035331 A1* | 1/2020 | Milenkovic | B01J 19/0046 |

OTHER PUBLICATIONS

Bornholt et al., "A DNA-Based Archival Storage System," ASPLOS, 2016, 13 pages.

Church et al., "Supplementary Materials for Next-Generation Digital Information Storage in DNA," Science, (2016), 16 pages.

Dimopoulou et al., "DNA Coding for Image Storage Using Image Compression Techniques," Coresa. (2018), 2 pages.

Dimopoulou et al., "On the Reduction of the Cost for Encoding/Decoding Digital Images Stored on Synthetic DNA," Gretsi, (2019), 5 pages.

Erlich et al, "DNA Fountain Enables a Robust and Efficient Storage Architecture," Science, vol. 355, (2017), pp. 950-954.

Goldman et al., "Toward Practical High-Capacity Low-Maintenance Storage of Digital Information in Synthesisted DNA," vol. 494, (2013), 9 pages.

Grass et al., "Robust Chemical Preservation of Digital Information on DNA in Silica with Error-Correcting Codes," Angew. Chem. Int. Ed., vol. 54, (2015), pp. 2552-2555.

Hughes et al., "Synthetic DNA Synthesis and Assembly: Putting the Synthetic in Synthetic Biology," Cold Spring Harb Perspect Biol., (2017), 17 pages.

Dimopoulou et al., "A Biologically Constrained Encoding Solution for Long-term Storage of Images onto Synthetic DNA," arXiv:1904.03024v1 [eess.IV] (2019), 5 pages.

Sanders, New DNA Synthesis Technique Promises Rapid, High-Fidelity DNA Printing, by University of California—Berkeley, (2018), (available at https://www.technology.org/2018/06/21/new-dna-synthesis-technique-rapid-high-fidelity-dna-printing/), 5 pages.

Organick et al, "Scaling Up DNA Data Storage and Random Access Retrieval," (2017), 14 pages.

Treangen et al., "Repetitive DNA and Next-Generation Sequencing: Computational Challenges and Solutions," Nat Rev. Genet., vol. 13, (2013), pp. 36-46.

Wikipedia, Oligonucleotide Synthesis, (2020). (available at https://en.wikipedia.org/wiki/Oligonucleotide_synthesis), 25 pages.

An introduction to Next-Generation Sequencing Technology, (2017), www.illumina.com/technology/next-generation-sequencing.html.

* cited by examiner

METHODS FOR STORING DIGITAL DATA AS, AND FOR TRANSFORMING DIGITAL DATA INTO, SYNTHETIC DNA

TECHNICAL FIELD

The disclosure, in various embodiments, relates generally to methods for encoding data as synthetic deoxyribonucleic acid (DNA), so as to store the digital data in the form of a synthetic DNA sequence. More particularly, this disclosure relates to methods for transforming digital data (whether binary or non-binary) into synthesized DNA encoded with a defined sequence of nucleotides.

BACKGROUND

The digital evolution has caused an immense increase in the amount of data that is being generated and stored. The digital universe is forecast to grow to over 160 zettabytes by 2025. At the same time studies show that after storage, 80% or more of this data might not be needed for months, years, decades, or may be ever. Storing such large amounts of data in a manner that avoids degradation of the data over very long data storage periods and in a media that occupies minimal physical spaces continues to present challenges.

BRIEF SUMMARY

According to some embodiments of the disclosure, a method for encoding digital data in synthetic DNA sequences, comprises, for an input data sequence comprising a set of symbols, constructing a codebook of codewords. Constructing the codebook comprises constructing a number of unique codewords of a nucleotide length. Constructing each of the codewords comprises, for an even nucleotide length, forming the codeword from a selection of nucleotide pairs from a first predefined dictionary of nucleotide pairs; and, for an odd nucleotide length, forming the codeword from the selection of nucleotide pairs from the first predefined dictionary of nucleotide pairs and from an additional selection of a nucleotide from a second predefined dictionary of individual nucleotides, wherein the number of unique codewords of the codebook is greater than a number of symbols of the set of symbols from the input data sequence. For each symbol of the set of symbols from the input data sequence, at least one codeword, of the codebook, is designated as associable with that symbol. The designation comprises, for at least one symbol of the set of symbols from the input data sequence, designating more than one codeword, of the codebook, as associable with that at least one symbol. Also, for the each symbol of the set of symbols from the input data sequence, the each symbol is coded as one codeword, selected from the designated at least one codeword associable with that symbol. A code is formed from the one codewords, the code comprising the one codewords arranged in an order corresponding to an order, of their respective symbols of the set of symbols, in the input data sequence. A synthetic DNA sequence is synthesized to have nucleotides ordered to match the code.

In some embodiments of the disclosure, a method for encoding digital data in synthetic DNA sequences comprises, for an input data sequence comprising a set of symbols, constructing a codebook of codewords. Constructing the codebook of codewords comprises constructing a number of unique codewords of a nucleotide length. Constructing each of the codewords comprises, for an even nucleotide length, forming the codeword from a selection of nucleotide pairs from a first predefined dictionary of nucleotide pairs having a greater percentage of A and T in the first predefined dictionary than a percentage of G and C in the first predefined dictionary; and, for an odd nucleotide length, forming the codeword from the selection of nucleotide pairs from the first predefined dictionary of nucleotide pairs and from an additional selection of a nucleotide from a second predefined dictionary of individual nucleotides. For each symbol of the set of symbols from the input data sequence, at least one codeword, of the codebook, is designated as associable with that symbol. Also for the each symbol of the set of symbols from the input data sequence, the each symbol is coded as one codeword, selected from the designated at least one codeword associable with that symbol. A code is formed from the one codewords, the code comprising the one codewords arranged in an order corresponding to an order, of their respective symbols of the set of symbols, in the input data sequence. A synthetic DNA sequence is synthesized to include nucleotides ordered to match the code.

In some embodiments of the disclosure, a method for encoding digital data in synthetic DNA sequences comprises, for an input data sequence comprising a set of symbols, constructing a codebook of codewords. Constructing the codebook comprises constructing a number of unique codewords of a nucleotide length. Constructing each of the codewords comprises, for an even nucleotide length, forming the codeword from a selection of nucleotide pairs from a first predefined dictionary of nucleotide pairs; and, for an odd nucleotide length, forming the codeword from the selection of nucleotide pairs from the first predefined dictionary of nucleotide pairs and from an additional selection of a nucleotide from a second predefined dictionary of individual nucleotides. For each symbol of the set of symbols from the input data sequence, at least one codeword, of the codebook, is designated as associable with that symbol. Also for the each symbol of the set of symbols from the input data sequence, the each symbol is coded as one codeword, selected from the designated at least one codeword associable with that symbol. A code is formed from the one codewords, the code comprising the one codewords arranged in an order corresponding to an order, of their respective symbols of the set of symbols, in the input data sequence. A synthetic DNA sequence is synthesized to include nucleotides ordered to match the code.

DETAILED DESCRIPTION

Disclosed are methods for synthesizing DNA to encode digital data therein. Also disclosed are methods for encoding data into synthesized DNA. The methods use a specific alphabet of nucleotides and implement, in at least some embodiments, a replication according to which one symbol in the data to be encoded corresponds to a plurality of codewords in a nucleotide alphabet. By embodiments of the disclosure, the methods efficiently produce a quaternary sequence that is robust to sequencing noise and respects the restrictions that accompany the creation of synthetic DNA. The methods enable encoding specific for the storage of digital data into DNA. Moreover, the methods enable encoding of a large amount of digital data-whether binary or non-binary-into a very stable medium, synthetic DNA.

For example, the methods may be used to encode so-called "cold data," such as old digital photographs, into synthetic DNA as a storage media, stable for a long and indefinite period of time. Consider old photographs stored by users on Facebook. Facebook recently built an entire data center dedicated to storing such "cold" photographs. Unfortunately, all conventional storage media used for cold data storage (e.g., Hard Disk Drives, tape) suffer from two fundamental problems. First, the rate of improvement in storage density is at best 20% per year, which substantially lags behind the 60% rate of cold data growth. Second, current storage media have a limited lifetime of five years (e.g., HDD) to twenty years (e.g., tape). As data is often stored for a much longer duration (e.g., 50 or more years) due to legal and regulatory compliance reasons, data stored in conventional media must be migrated to new storage devices every few years else the stored data will degrade past the point of being reliably and accurately retrievable. This data migration increases the price of data ownership and increases the likelihood of unintended data loss.

By the methods of this disclosure, data is encoded in the form of synthetic DNA. With naturally-occurring DNA, it supports heredity in living organisms. Like naturally-occurring DNA, synthetic DNA (i.e., lab-created and not naturally-occurring DNA) can possess three key properties that make it viable as a medium for archival storage of digital data. First, it is an extremely dense three-dimensional storage medium that has the theoretical ability to store 455 Exabytes of data in 1 gram worth of storage medium; in contrast, a conventional 3.5" HDD can store only about 10 TB of data and weighs 600 grams. Second, DNA can last several centuries even in harsh storage environments; in contrast, conventional HDD and tape have life times of about five years and thirty years, respectively. Third, it is very easy, quick, and cheap to perform in-vitro replication of DNA (e.g., data copying); in contrast, conventional tape and HDD have bandwidth limitations that may require hours or days for copying large EB-sized archives.

DNA is a complex molecule corresponding to a succession of four nucleotides (nts), Adenine (A), Thymine (T), Guanine (G), and Cytosine (C). It is this quaternary genetic code that inspired the idea of DNA as a data storage medium in the expectation that any binary information can be encoded into a DNA sequence of A, T, C, and G. The main challenge of using DNA as a data storage medium lies in the restrictions imposed by the biological procedures of DNA synthesis (writing) and sequencing (reading) that are involved in the encoding process. Conventional synthesis and sequencing processes can introduce significant errors in the encoded sequence, and they are also relatively costly (several dollars for writing and reading a small strand of nucleotides).

Efforts have been made to tackle the problem of digital data storage onto DNA. For example, efforts have included dividing an original file into overlapping segments so that each input bit is represented by multiple oligos. (As used herein and in the art, an "oligo" means and refers to an oligonucleotide, a short, single-stranded nucleic acid fragment of, e.g., a DNA strand.) Other efforts have suggested the use of Reed-Solomon code to treat erroneous sequences, while other efforts have used encoding methods that approach the Shannon capacity. Still other efforts have introduced a clustering algorithm to provide a system of random-access DNA data storage. Nevertheless, all these approaches mainly try to convert a binary bit stream onto a DNA sequence without considering the original input data characteristics.

By the methods of this disclosure, the methods take advantage of the optimal compression that can be achieved even before synthesizing a sequence into physical DNA. The methods, therefore, enable significant cost savings, compared to conventional methods. Moreover, although some conventional methods have used compressed data, such as images in a JPEG format, the final encoding of those methods has been carried out on the compressed bit stream without interfering with the compression procedure. The methods of this disclosure, on the other hand, can be applied on any type of input data, as opposed to being limited to transcoding binary streams into quaternary. Furthermore, methods of this disclosure avoid the construction of pattern repetitions that can occur in the case when the same input symbol is repeated many times. Avoiding the pattern repetitions may avoid errors in the synthesis and/or sequencing of the DNA storage medium. Overcoming these challenges, the methods disclosed herein enable the practical application of storing data in a DNA medium through the use of a new, robust encoder process, adaptable to any input sequence that can encode digital data into a quaternary stream.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable scientific or manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a DNA sequence or DNA strand described as "comprising," "including," and/or "having" an oligomer sequence may be a structure that, in some embodiments, includes additional compound(s) as well and/or a structure that, in some embodiments, does not include any other compound(s). Likewise, a method described as "comprising," "including," and/or "having" a stage, phase, technique, process, or other act(s) may be a method that, in some embodiments, includes additional stage(s), phase(s), technique(s), process(es), or other act(s) as well and/or a method that, in some embodiments, does not include any additional stage(s), phase(s), technique(s), process(es), or other act(s) than those described.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a method technique or a structure's composition and arrangement so as to facilitate a referenced operation or property of the referenced method technique or structure in a predetermined way.

The illustrations presented herein are not meant to be actual views of any particular method or stage, phase, technique, process, or other act thereof, but are merely idealized representations that are employed to describe embodiments of the disclosure.

Methods disclosed use DNA data coding in which a stream of data is encoded into a quaternary sequence of A, T, C, G nucleotides. The quaternary sequence is thereafter synthesized into physical synthetic DNA (i.e., not naturally occurring DNA) that can be safely stored for many years without loss of information. The stored DNA can be retrieved using the biological process of DNA sequencing and then decoded to reconstruct the stored digital data. The methods involve processes of encoding digital data, so that it can be subsequently decoded to reliably read the original, input digital data. Thus, the methods involve the biological-based procedures of DNA synthesis (writing) and, eventually involve sequencing (reading).

DNA synthesis (writing) and sequencing (reading) are mechanisms that are error prone in the conventional synthetic implementations, imposing fundamental restrictions on the encoding process. However, DNA synthesis can be an error-free procedure, as long as the DNA strands to be synthesized are no longer than 150 nts to 300 nts. When the sequences to be encoded in DNA strands are longer than about 300 nts, synthesis errors tend to increase exponentially. To eliminate such synthesis errors, the disclosed methods take an overall sequence—to be synthesized by the methods disclosed—and essentially cut it into shorter pieces (e.g., chunks, fragments), while formatting the pieces in such a way that the initial sequence is reconstructable during subsequent synthesizing and decoding (e.g., sequencing) acts that result in physical synthetic DNA storing the encoded digital data in readable format. More particularly, the methods of the disclosure construct, from an initial input data, a code (i.e., a defined sequence of codewords made up of nucleotides) in relatively short lengths (e.g., no longer than 150 nts to 300 nts), which code is thereafter usable in growing an oligonucleotide sequence exhibiting the same order of nucleotides, to form synthetic DNA that effectively stores the initial input data. Such processes for formatting the DNA sequences for synthesis are discussed further below.

Before delving into the methods for determining and formatting sequences to be encoded, according to embodiments of the disclosure, consideration of the sequencing errors that tend to arise from DNA sequencing procedures may be helpful. Currently, there are understood to be three main restrictions that should be respected in determining DNA sequences to be synthesized. First, in the DNA sequence, consecutive occurrences of the same nucleotides should be avoided. Second, the percentage of G and C in the oligos should be lower than or equal to the percentage of A and T in the oligos. Third, so-called "codewords," used to encode the oligos, should not be repeated to form the same pattern throughout the length of the oligo. Abiding by these three restrictions, sequencing errors may be reduced. The methods disclosed encode quantized wavelet coefficients using codewords that follow the aforementioned restrictions.

Figure 1:
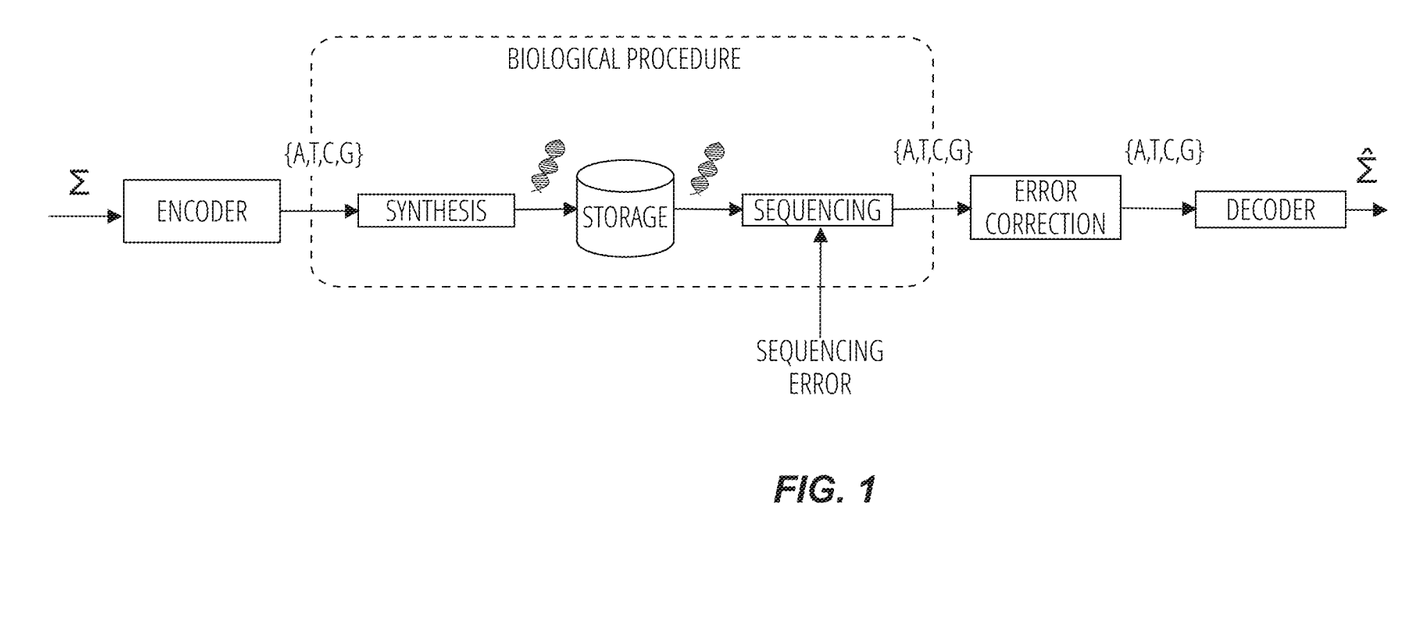
FIG. 1 is a diagram representing a general encoding schema, according to embodiments of the disclosure.

With reference to FIG. 1, shown is a general process for DNA data encoding and use. The process includes four main stages. The first stage is the encoding ("ENCODER" of FIG. 1), wherein data is encoded into a quaternary code of A, T, C, and G nucleotides. The encoding uses a technique, disclosed herein, that is robust to sequencing errors. As part of the encoding process, the quaternary code of A, T, C, and G (e.g., encoded sequences) are cut into "chunks" (oligos) and modified (e.g., formatted) to include headers to produce final oligos. The final oligos are then processed biologically in vitro so that, in the second stage of the process ("BIOLOGICAL PROCEDURE" of FIG. 1), the final oligos are synthesized into DNA ("SYNTHESIS" of FIG. 1), stored ("STORAGE" of FIG. 1), and then copied and retrieved using the sequencing procedure ("SEQUENCING" of FIG. 1) when the data is needed. The third stage of the process is error correction ("ERROR CORRECTION" of FIG. 1), which may be applied, if needed, to address sequencing errors, if any, introduced in retrieving (e.g., accessing) the stored, encoded DNA sequences. Finally, the fourth stage ("DECODER" of FIG. 1) of the process involves reconstructing, from the sequence of oligos encoded in the synthetic DNA, the initial digital data (e.g., a digital image).

Embodiments of this disclosure provide methods using a novel encoding technique, which is robust to the common biological errors of DNA synthesis and sequencing. Unlike previous efforts, the encoding techniques, according to embodiments of the disclosure, respect the restriction of not creating pattern repetitions that could cause problematic sequencing errors. Furthermore, the encoding techniques and methods disclosed are very flexible and adaptable to any potential encoding needs. Importantly, the methods and encoding techniques of this disclosure are suitable for application to any type of data, in contrast to some previous efforts that are limited to data in binary form, i.e., they are constructed to transcode exclusively binary input streams into quaternary code. Finally, the disclosed methods and encoding techniques are suitable for application in data compression (e.g., on image coding). In data compression embodiments, the disclosed methods and encoding techniques enable a reduction of DNA synthesis expenses because the methods use an optimized encoding technique for the construction of the encoding "codebook."

Embodiments of the disclosure use an encoding technique in which at least some input data is encoded using a quaternary code composed of the alphabet {A,T,C,G}, which is subsequently synthesized into physical, synthetic DNA. By the encoding technique, an input data set $\Sigma$ of $\{s_1, s_2, \ldots, s_k\}$ (wherein k represents the number of symbol members of the set $\Sigma$), is encoded according to mapping each symbol to a codeword of a codebook $C^*$ of $\{c_1, c_2, \ldots, c_L\}$ (wherein L represents the number of codeword members of the codebook $C^*$), each codeword being a quaternary codeword of length l (i.e., l number of nucleotides). The encoding technique generates a code $\Gamma$, where:

$$\Gamma : \Sigma \to C^*$$

Herein, $$\Gamma_{(s_i)} = c_i$$

is denoted as the codeword, from the codebook $C^*$, associated with the symbol $s_i$ of the input data set $\Sigma$, i.e.:

$$s_i \in \Sigma$$

Construction of the codebook $C^*$ meets or substantially meets the above-described restrictions imposed by the biological procedures included in the process of DNA data coding. According to methods of the disclosure, codewords are created from a set of duplets (pairs of nucleotides), which creates an acceptable sequence when assembled in a longer strand. This encoding and assembly technique avoids creation of homopolymer runs (e.g., duplicates), and it produces sequences that contain a percentage of G and C that is less than or equal to the percentage of A and T.

More precisely, the codewords are constructed by selecting elements from the following dictionaries:

$C_1$={AT, AC, AG, TA, TC, TG, CA, CT, GA, GT}
$C_2$={A, T, C, G}

Codewords of an even length (i.e., an even number of nucleotides) l are constructed by selecting l/2 pairs from dictionary $C_1$. Codewords of an odd length are constructed by selecting (l-1)/2 pairs from dictionary $C_1$ while also adding, to an end of the codeword, an entry from dictionary $C_2$.

Notably, dictionary $C_1$ consists of only pairs of nucleotides that, when assembled in a longer strand, will respect some biological restrictions. For example, to ensure that the code does not create homopolymers (e.g., strands with repeated oligomers), dictionary $C_1$ does not contain pairs of the same nucleotide. This means that the pairs AA, TT, CC, and GG are not included (e.g., are omitted) from dictionary $C_1$. Furthermore, to keep the C and G percentage, in the resulting sequences, lower or equal to the percentage of A and T in the resulting sequences, dictionary $C_1$ also does not include the pairs GC and CG. Thus, as so-far described, the encoding technique used in the methods of this disclosure address and comply with the first two restrictions described above: avoiding consecutive occurrences of the same nucleotides and ensuring the percentage of G and C in the oligos (and, e.g., in the sequences comprising the oligos) is less than or equal to the percentage of A and T in the oligos (and, e.g., in the sequences comprising the oligos).

To construct a codeword of length l, the first [(l-1)/2] nucleotide pairs of the codeword are defined by choosing symbol pairs from dictionary $C_1$. There are:

$$10^{\lfloor \frac{l-1}{2} \rfloor}$$

different choices for filling those first nucleotide pairs of the codeword. Then, to fill in the last nucleotide in the case of codewords of odd length l, or equivalently the last pair of nucleotides in the case of codewords of even length l, a nucleotide entry is chosen from dictionary $C_2$ (for l being odd) or a last pair of nucleotides is chosen from dictionary $C_1$ (for l being even).

In embodiments or implementations in which the number k of different symbols $s_k$ to be encoded is less than or equal to four (4), the encoding technique notably would avoid using symbols only from dictionary $C_1$. Otherwise, in implementations or embodiments in which the input data sequence (e.g., $\{s_1, s_1, s_1, s_2\}$) includes the same symbol $s_k$ repeated many times in a row, the resulting code may also include either homopolymer runs or pattern repetitions, such that the code may not be biologically robust. Consequently, even though—with such few numbers of input symbols, it is feasible to have an encoding rate R equal to 1 nucleotide (codeword) per input symbol, the methods herein avoid such a one-nucleotide-to-one-input-symbol association, which ensures robustness of the resulting code. As a result the codebook size L is determined by the following relation:

$$L = \begin{pmatrix} 10^{\frac{l}{2}}, & \text{if } l \text{ is even} \\ 10^{\lfloor \frac{l}{2} \rfloor} * 4, & l \text{ is odd} \end{pmatrix}$$

Consequently, the codebook length increases at an order of O(n). More specifically, in a worst case scenario in which one needs to add an extra pair of symbols to the codeword length to cover the needed size k of symbols to be encoded into quaternary, the codebook size L will increase by ten codewords. This codebook extension can be relatively big compared to the encoding needs, and it can possibly leave a big part of codewords unused. However, this unused part can be exploited to deal with the last biological restriction, as discussed above, of avoiding the repetition of codewords that are used to encode the oligos so that patterns do not form throughout the oligo length. Thus, the encoding technique avoids the pattern repetitions that would otherwise occur if the same symbol was repeated many times in the initial sequence. By the present encoding technique, each symbol $s_i$ from the input data set $\Sigma$ is replicated m number of times, such that the number L of codewords $c_i$ in the codebook $C^*$ will be a multiple of k (i.e., the number of symbols in the input data set $\Sigma$) and m (i.e., the total number of codewords $c_i$ in the codebook $C^*$ that are associated with each input symbol $s_i$). Thus, each symbol $s_i$ in input set $\Sigma$ is represented by more than one of the codewords $c_i$ in the codebook $C^*$ in such a way as to make use of the full codebook length L. Using this "replication phase" of the methods of this disclosure, in every repetition of the same symbol in an input sequence, a different codeword will be selected for its respective encoding, avoiding the creation of long pattern repetitions in the final encoded sequence even when encoding input sequences that includes symbol repetitions.

Provided further herein are different mapping procedures, according to various embodiments of the methods of the disclosure, each mapping procedure using a different replication technique. Further explanation about such encoding techniques, and the replication techniques thereof, is discussed below.

In some embodiments, the mapping procedure of the encoding technique is based on a pseudorandom association of a symbol in set $\Sigma$ to one or more possible codewords from codebook $C^*$. As explained above, the mapping procedure is tailorable according to the needs of the encoding. In embodiments in which having a more robust encoding is desired, the mapping procedure may use a replication phase in which the mapping procedure ensures that at least one symbol from set Σ is associable with more than one codeword in the codebook C*. In some embodiments, each of the symbols from set Σ is associable with more than one codeword in the codebook C*, such that the symbol set Σ fits multiple times into the codebook C*. The replication phase increases the robustness of the encoded sequence by inserting more randomness, which may also be used to provide detectability of errors, if any, occurring in the DNA synthesis and sequencing stage, as discussed further below.

Figure 2A:
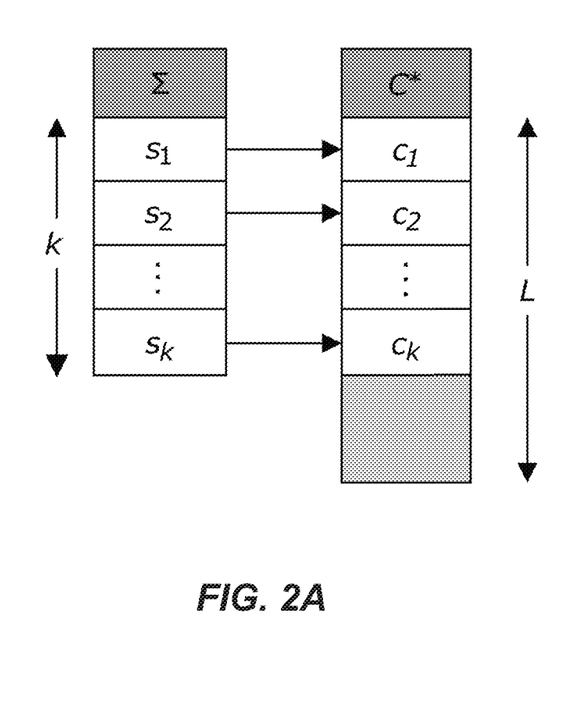
FIG. 2A and FIG. 2B are diagrams of procedures for mapping quantized values into quaternary code, according to embodiments of the disclosure.

Use of the replication phase may increase the encoding cost. Therefore, in some embodiments, the replication phase may be omitted, e.g., if the benefit of encoding robustness (e.g., avoiding codeword repetitions in the resulting code and synthesized DNA) is outweighed by the final encoding cost. FIG. 2A diagrams a mapping procedure that does not include the replication phase. By this mapping procedure, each symbol $s_1$ of input data set Σ is associable with only one codeword $c_i$ of the codebook C*. In other words, s1 is encodeable only as c1, s2 is encodeable only as c2, and so on with $s_k$ encodeable only as $c_k$. Therefore, for an input sequence of $\{s_9, s_{14}, s_{22}, s_5, s_{14}, s_{20}\}$, the resulting code will be the codeword sequence $\{c_9, c_{14}, c_{22}, C_5, c_{14}, c_{20}\}$.

Figure 2B:
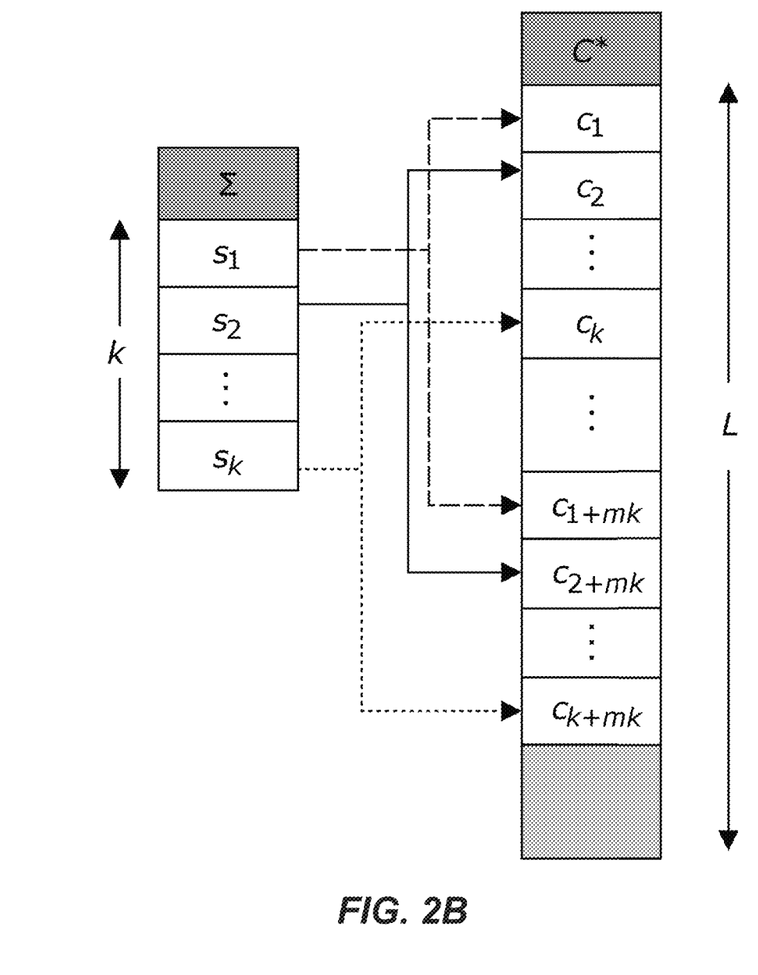

In embodiments in which the mapping procedure includes the replication phase (e.g., in embodiments in which the robustness of the encoding outweighs the additional cost of performing the replication phase), the mapping procedure may be represented by the diagram of FIG. 2B. In such embodiments, the code Γ is constructed so that each symbol in set Σ is mapped (e.g., associable) to a set (codebook C*) of m number of different non-empty quaternary codewords in the codebook C*, following a one-to-many relation in such a way that each symbol-to-codeword association is unique from the others; and thus, each codeword is uniquely decodable. Because the method ensures the codebook size L (i.e., the number of unique codewords within the codebook C*) is at least twice the size k (i.e., the number of unique symbols within the input data set Σ), such that L≥2×k, the pseudorandom mapping at least provides two associable codewords for each input symbol.

The value of m is determined by discerning the number of times that the input data set Σ fits into the codebook C*, as follows:

$$m = \left\lfloor \frac{L}{k} \right\rfloor$$

The mapping procedure, according to such encoding techniques that include a replication phase applied to each symbol from the input data set Σ, the mapping procedure may comprise or consist of.

first, building the corresponding codebook C* of size L using all possible codewords of length l that can be built following the restrictions described above;

second, computing the number of times m that the number k of symbols of the input data set Σ can be replicated into the total size L of the codebook C*, wherein:

$$m = \left\lfloor \frac{L}{k} \right\rfloor$$

third, mapping the quantized value (i.e., the symbol $s_i$) to a codeword $c_i$, wherein the code for the quantized value (i.e., codeword $c_i$ providing the code for the symbol $s_i$) is defined as:

$\Gamma_{(s_i)} = C *_{(i+\text{rand}(0,m-1)*k)}$ wherein the term "rand(0, m−1)" is a function that randomly draws a number from the set of integer numbers between 0 and m−1. For example, according to the above relationship, $s_1$ is associable to the codewords $c_1$, $c_{1+k}$, $c_{1+2k}$, . . . $c_{1+(m-1)k}$.

The encoding procedure may be represented by STEP COMBINATION 1 as follows:

Step Combination 1: Encoding Procedure for a Known Set of Symbols Σ, Wherein k is Given First, determine length l of codewords needed for encoding all k symbols of the input data set Σ, i.e.:

$s_i \in \Sigma$ wherein:

if:

$\log_{10} k$ is not an integer, then if:

$10^{\lfloor \log_{10} k \rfloor} * 4 \leq k$ then:

$l = \lfloor \log_{10} k \rfloor * 2 + 1$ otherwise:

$l = \lfloor \log_{10} k \rfloor * 2 + 1$ otherwise:

$l = \log_{10} k * 2 + 1$

Second, build the codebook C* of L number of different (i.e., unique) codewords $c_i$, wherein:
if l is even, then construct all possible codewords of length l by using l/2 choices from dictionary $C_1$;
otherwise (i.e., if l is odd), then construct all possible codewords of length l by using l/2 choices from dictionary $C_1$ and adding one entry from dictionary $C_2$.

Third, map the index of quantized values (i.e., map the set Σ of symbols $s_i$) to codewords $c_i$ from codebook C*, comprising:
applying a replication phase, wherein m [L/k]; and
determining a code (i.e., codeword) for each symbol $s_i$ of the input data set Σ according to a predetermined mapping rule, such as one in which the code (i.e., codeword) for each symbol $s_i$ is randomly selected from all codewords associable with that particular symbol (and not from other codewords not associable with that particular symbol), e.g.:

$\Gamma_{(s_i)} = C *_{(i+\text{rand}(0,m-1)*k)}$

Fourth, determine the final code to be synthesized as a synthetic DNA sequence, wherein the final code is defined by ordering the determined code (e.g., codeword) for each symbol $s_i$ in the same order as its respective symbol $s_i$ from the input data sequence. Notably, the code produced using STEP COMBINATION 1 is uniquely decodable because no unique codeword represents more than one symbol $s_i$.

In some embodiments, rather than determining the number m of replications of symbols-to-codewords to be used when constructing the codebook C* based on m=[l/k], m may be selected using either a random generator (e.g., a random number generator) or using a predetermined function (e.g., predefined by an individual carrying out the encoding technique).

Embodiments that include a replication phase for at least one symbol (e.g., wherein m is at least 2), the replication phase may enable error correction if errors occur during DNA sequencing and synthesis. More precisely, when encoding each symbol $s_i$ in the input data (e.g., input data set Σ), m may be selected, using a known function such that m number of codewords in the codebook C* represent the same symbol $s_i$ from the input data set Σ. Thus, in such embodiments, it can be assumed that there are m number of different codeword classes (e.g., sub-codebooks $C_i$*). Consequently, if an error occurs in the DNA synthesis or sequencing, or in the DNA decoder, whereby a codeword belonging to one class is turned into a codeword that belongs to another class, one will be able to detect that an error has occurred in this position, correcting it to the closest codeword belonging in the correct class.

That is, because of the mapping procedure used in the encoding techniques, the present methods enable easy detection of synthesis or sequencing errors, if any. As a hypothetical example, consider an input set that consists of only two symbols, $s_1$ and $s_2$ in set Σ. Assume also that there are four codewords c1, c2, c3, and c4 in codebook C*. In an embodiment in which there is only a single replication (i.e., m=1), then the codebook C* effectively has two sub-codebooks: C1* (from the first instance of the codewords that correspond to each of the symbol members of input set Σ) and C2* (from the second, replicated instance of the codewords that correspond to each of the symbol members of input set Σ). Thus, symbol s1 is encoded by either symbol c1 (from C1*) or c3 (from C2*), while symbol s2 is encoded by either c2 (from C1*) or c4 (from C2*). In an embodiment in which a mapping process is not randomized, the mapping process may be defined based on a deterministic rule, such as the following: if the symbol "s" to be encoded is at an odd position in a data input sequence to be encoded, then symbol "s" is encoded using sub-codebook C1*; however, if the symbol "s" to be encoded is at an even position in the data input sequence to be encoded, then the symbol "s" is encoded using sub-codebook C2*. Thus, if provided a sequence {s1, s1, s2, s1} to encode, then applying the deterministic rule for the mapping process yields a code consisting of codeword sequence {c1, c3, c2, c3}. A strand of synthetic DNA is then synthesized and sequenced to include oligonucleotides in the order of the code of {c1, c3, c2, c3}, with the particular A, T, C, G contents of each codeword defined according to the formation of the codebook C*, as discussed above. If an error in the synthesis or sequencing unintentionally introduced an error, such that the resulting oligonucleotide sequence turned out to be {c1, c2, c2, c3}, the present methods enable easy detection of the error of the "c2" at the second position in the code because, according to the deterministic rule applied for the mapping process, "c2" is a codeword that is not an available candidate for a codeword selected for an even (e.g., second) position. Any symbol at an even position must, according to the deterministic rule, be selected from sub-codebook C2*, which does not include codeword c2. This means, that the sequence of {c1, c2, c2, c3} included an error at the second position. Such error can be quickly and easily corrected—e.g., before re-synthesizing and re-sequencing to form a DNA strand of the correct code—by replacing the errant "c2" at the second position with the next closest symbol in the correct sub-alphabet, e.g., "c3" from C2*.

It should be recognized that, while the aforementioned hypothetical example includes a small number of symbols in input set Σ and a small number of codewords in codebook C*, the same mapping process—and easy error-detection technique—are equally applicable to embodiments in which there are numerous symbols in the input data set Σ and numerous codewords in codebook C*.

In some other embodiments, the replication phase may be applied only to those symbols, of input data set Σ, that occur most frequently in the input data sequence. In such embodiments, the resulting size of the coded, synthetic DNA sequence may be reduced (due to not including, in the codebook C* multiple codewords for the infrequently-occurring symbols from the input data sequence) while still avoiding most potential pattern repetition in the resulting code (due to the replication phase applied to the more-frequently-occurring symbols from the input data sequence).

As a hypothetical example of such an embodiment, if there are only two symbols s1 and s2 in an input data sequence (such that set Σ consists of s1 and s2), and if symbol s1 occurs much more frequently in the input data sequence than symbol s2 in the input data sequence to be encoded, the replication phase may be applied to only the more frequently occurring s1 symbol and not to the less frequently occurring s2 symbol. For example, s1 may be replicated once (i.e., m=1) to provide a total of two associable codewords c1 and c2 in the codebook C*, while s3, not being replicated (i.e., m=0) for a total of only one associable codeword c3 in the codebook C*. Therefore, the codebook C* is only three codewords (c1, c2, c3) in length L. In some such embodiments, with a mapping procedure using pseudorandom association, an applicable coding rule may be as follows: where the input data sequence includes symbol s1, the symbol s is encoded as a codeword randomly selected from among the codewords associable with s1 (i.e., randomly selected from codewords c1 and c2); and where the input data sequence includes symbol s2, the symbol s2 is encoded as codeword s3. Accordingly, if the input data sequence is {s1, s1, s2, s}, applying the mapping procedure according to the coding rule discussed, the resulting code sequence may be {c1, c2, c3, c11}.

It should be recognized that the above hypothetical example uses a codebook C* of only three codewords {c1, c2, c3}. Such a codebook C* may not robustly avoid pattern repetition. For example, with the example input data sequence of {s1, s1, s2, s1} and the applicable mapping procedure as discussed, the resulting code sequence could-due to the pseudorandom selection of codewords to encode symbol s1—have been {c1, c1, c3, c1}, with a repetition of the codeword c1. As discussed above, however, an optimized codebook C* would include at least four codewords {c1, c2, c3, c4} to reduce the likelihood of codeword repetition in the resulting code, while still minimizing the size L of the codebook C*. Nonetheless, reducing the number of codewords in the codebook C* may enable a reduction in the length l of each codeword $c_i$ in the codebook C*, which may then enable minimization of the length (e.g., number of nucleotides) included in the synthesized DNA. Forming shorter DNA sequences reduces the costs of the DNA synthesis stage.

For the foregoing reasons, embodiments that include the replication phase of the mapping procedure—particularly the greater the number of input data symbols $s_i$ that are subjected to the replication phase—may have an increased DNA synthesis cost than compared to those embodiments that do not include the replication phase or that include the replication phase for only the most frequently occurring symbols of an input data sequence. However, the inclusion of the replication phase provides code sequences that are more robust to the biological error because of the decreased likelihood of repeated codewords in the code and, therefore, repeated nucleotide patterns in the synthesized DNA. Thus, depending on the needs and the purposes of the encoding, a user may select whether the replication phase is necessary or not and as to how many symbols of the input data sequence the replication phase is applied. In other words, in some embodiments, the replication phase will be included in the method, while, in other embodiments, the replication phase will not be included in the method; and, in those embodiments that include the replication phase, the replication may be applied for all symbols of the input data sequence or for only one or more (but not all) of the symbols of the input data sequence.

Optimization of Quality—Application to Digital Image Data for Image-to-DNA Encoding As described above, the encoding technique of methods of this disclosure provide a procedure usable for a known set (e.g., dictionary) of symbols (e.g., input data set Σ). Regardless of whether the mapping procedure, of the methods, includes a replication phase (FIG. 2B) or does not (FIG. 2A), in some embodiments according to the methods described above, a part of the codebook C* may be unused (the unused portion represented, in FIG. 2A and FIG. 2B by the lighter gray shading). However, in embodiments in which the encoding technique is to be applied to encode, into synthetic DNA, digital data in the form of an image, the mapping procedure may be modified somewhat to optimize and fully use the codebook C* in the mapping procedure.

For example, in embodiments in which the methods are used to encode image data, a Discrete Wavelet Transform (DWT) is applied, first, to decompose the initial data (e.g., image data) into subbands (e.g., which subbands each provide an input data set Σ) and then to independently quantize each wavelet subband (E). The quantized values may then be encoded, using the encoding technique described above or below into quaternary codewords comprising A, T, C, and G.

In some embodiments, optimization of the compression (i.e., the decomposition of the image data into subbands and the independent quantization of each wavelet subband) may be achieved using a source allocation process in which an optimal quantization step-size q is selected for each subband of the DWT used to decompose the image data. That is, the source allocation process determines an optimal size k for the subbands that will be individually quantized. This minimizes the compressed image's visual distortion $D_T$ resulting from the image-to-DNA encoding method, for a given target compression rate $R_{target}$.

More precisely, the source allocation process (also referred to herein as a "nucleotide allocation" process) estimates the optimal combination of subband rates $R_j$, which give a final total rate $R_T = R_{target}$ and a minimum total distortion $D_T$. For example, each subband rate $R_j$ is related to the final total rate, $R_T$, by the following relationship:

$$R_T = \frac{1}{B}\sum_{j=1}^{B} a_j R_j$$

wherein.

B is the number of subbands, and $a_j$ is a coefficient that depends on the size of the subband. For example, the coefficient $a_j$ for the subband j is equal to $m_j/M$, where $m_j$ is the size of subband j and M is the size of the original image before being decomposed into B subbands. It should be noted that a subband corresponds to a sub-image composed of pixels, the number of pixels of the subband being less than the number of pixels of the original image.

Figure 3A:
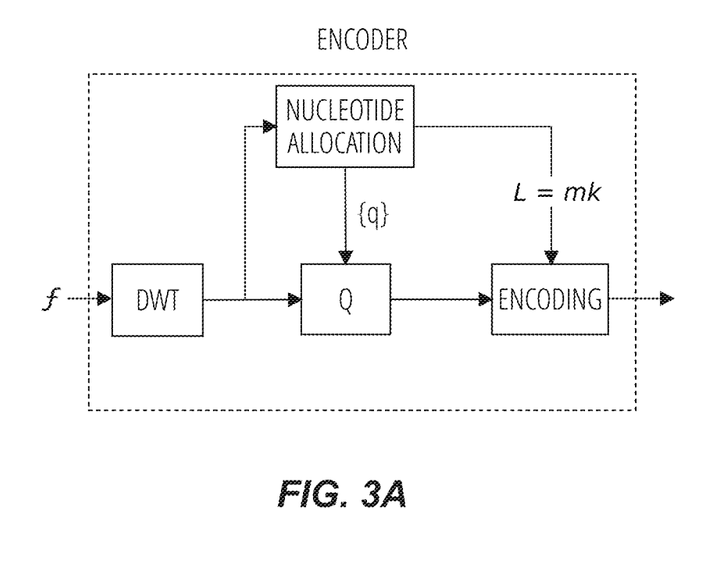
FIG. 3A and FIG. 3B are diagrams of a general DNA encoding schema for image coding, according to embodiments of the disclosure.
Figure 3B:
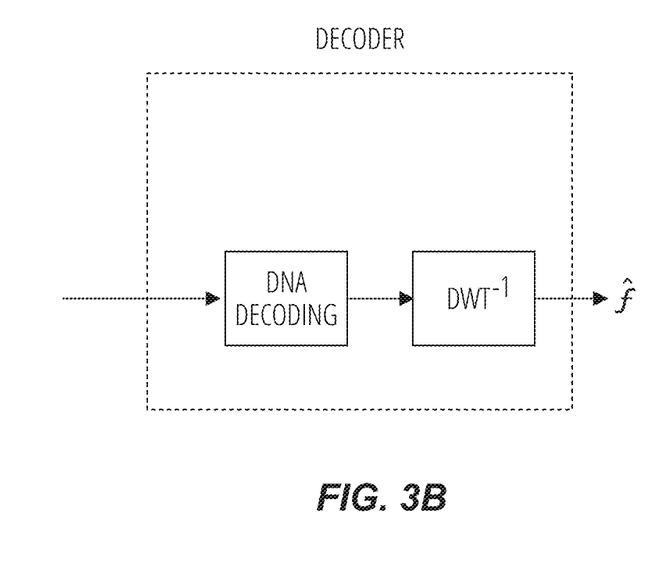

FIG. 3A diagrams an embodiment in which the DNA encoding method includes such image compression, with FIG. 3B diagraming a subsequent decoder phase to read, from the encoded synthetic DNA, the image data.

Above, described are methods in which a given set of symbols is encoded into quaternary codewords (e.g., A,C, T,G codewords) from which DNA is to be synthesized. However, in embodiments in which the encoding methods are used to encode data initially in the form of an image, the nucleotide allocation portion of the process (e.g., the source allocation process) uses a technique that allows the construction of an optimized codebook C* according to the restrictions discussed above. More particularly, according to this technique, a subband rate $R_j$ (e.g., number of nucleotides per pixel of subband j or, equivalently, the ratio between the number of bits for the subband j before encoding and the number of nucelotides necessary to encode these bits of subband j) is selected (e.g., predefined, given). Given this input rate $R_j$, the maximum number of codewords that the codebook C* can provide is determined. Thus, determined is the maximum number of codewords that can be included in the codebook C*. More particularly, the optimized encoding technique for imaging encoding embodiments is as follows:

To begin with, this encoding technique uses a fixed codeword length of size l (i.e., a predefined number of nucleotides defining each codeword in the codebook C*). Thus, a predefined subband rate $R_j$ effectively defines the length l of the codewords $c_i$ in the optimized codebook $C_j^*$, in that $R_j$ equals l. Consequently the codebook length L can be computed using l as follows:

$$L = \begin{pmatrix} 10^{\frac{l}{2}}, & \text{if } l \text{ is even} \\ 10^{\frac{l-1}{2}} *4, & \text{if } l \text{ is odd} \end{pmatrix}$$

Figure 4:
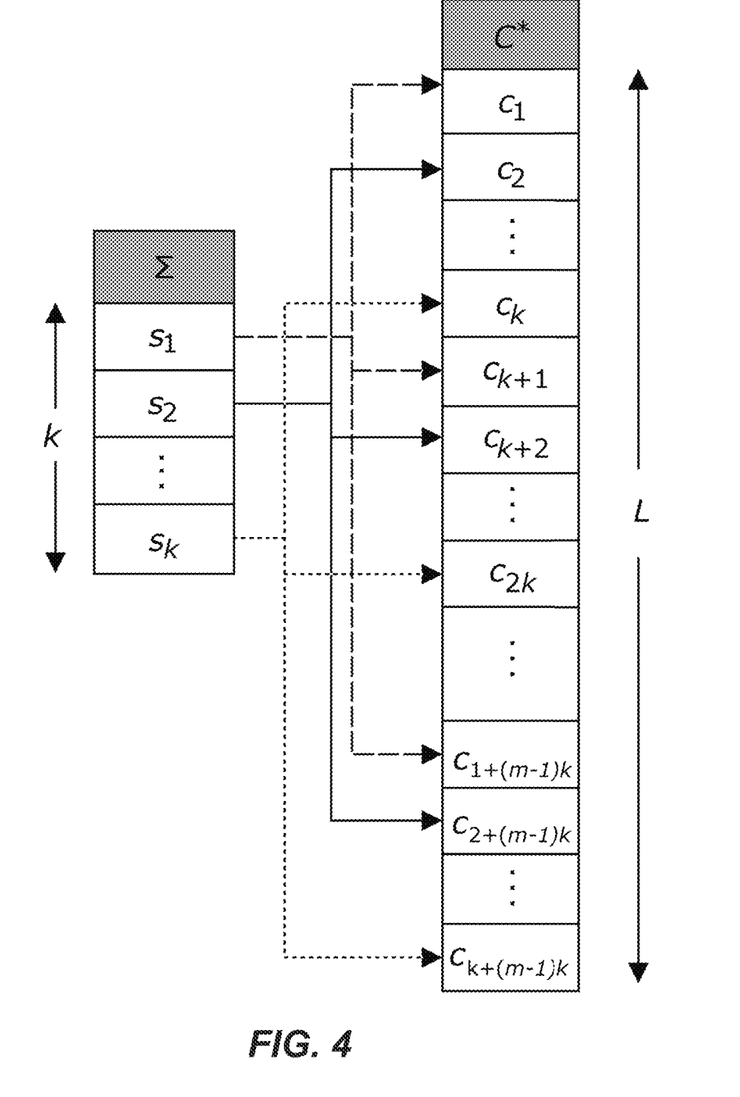
FIG. 4 is a diagram of an optimized procedure for mapping quantized values into quaternary code for image coding application.

Next, the needed number m of replications is determined. To ensure a robust encoding technique, every codeword in the codebook C* should be represented by (e.g., associable with) at least two different codewords in the codebook C*. Therefore, the needed number of replications is at least two (i.e., m≥2). In some embodiments, for no nucleotide waste, each of the symbols $s_i$ from the input data set Σ is subjected to the replication phase only once, such that each codeword in the codebook C* has only one other codeword associated with the same input symbol $s_i$. In such embodiments, the value of m is two (m=2). In such embodiments, limiting the number of replications m to two ensures robustness by avoiding pattern repetitions while also using the greatest number of possible codewords for representing different symbols from the input set Σ. Finally using k=[L/m], the maximum number k of quantization values (i.e., the maximum number k of symbols $s_i$) that can be represented in the codebook C* is determined. Using this mapping process of the encoding technique, all the length L of the codebook C* is used in the mapping procedure, leading to an optimization of the encoding technique and the method of encoding the image data into synthetic DNA. FIG. 4 diagrams such an optimized mapping process.

In some embodiments, the optimized mapping process for an encoding technique to be applied to image data, wherein the encoding technique includes DWT, comprises STEP COMBINATION 2, as follows:

Step Combination 2: Encoding Procedure for Optimizing the Number of Subbands (i.e., Number k of Members of Encoding Input Set Σ) into which the Image is Decomposed, Given a Target (e.g., Predefined) Compression Rate $R_{target}$ and Target (e.g., Predefined) DNA Sequence Length X.

First, define the compression rate $R_{target}$, which equals the length (number of nucleotides) of each of the codewords to be included in the codebook C*.

Second, determine the size L of the codebook C* (i.e., determine the maximum number of unique codewords needed for the codebook C*), wherein:
if l is even, then:

$$L = 10^{\frac{l}{2}}$$

otherwise (i.e., if l is odd), then:

$$L = 10^{\frac{l-1}{2}} * 4$$

Third, construct the codebook C* to include L number of unique codewords of length l formed from dictionaries $C_1$ and $C_2$, as described above.

Fourth, determine the number k of symbols of an input data set (i.e., subband) Σ that can be encoded using the codebook C*, wherein k=L/m, and m is predefined as the number of desired symbol-to-codeword replications, as discussed above. For optimization, the number m of desired replications for symbols-to-codewords in the codebook C* is two (i.e., m=2). However, as discussed above, in other embodiments, the number m of desired replications of codewords in the codebook C* may be greater than 2 (i.e., m>2).

Fifth, each subband is individually subjected to a mapping procedure to encode the symbols of each subband to codewords from the codebook C*, by applying a predetermined coding rule. In some embodiments, the predetermined coding rule may include, for a particular symbol (e.g., $s_1$ of FIG. 4) randomized selection of one codeword from the multiple codewords associable with that particular symbol (e.g., selecting one codeword from among $c_1$, $c_{k+1}$, and $c_{1+mk}$ of FIG. 4). In such embodiments, the code (Γ) for an input symbol $s_i$ may be represented as:

$$\Gamma_{(s_i)} = C * (i + \text{rand}(0, m-1) * k)$$

Ordering the codewords selected for each input symbol in the same sequence as the sequence of the associated symbol from the input data sequence (i.e., subband), provides the code sequence for the input.

Resulting from the encoding techniques, whether using the mapping process of FIG. 2A, FIG. 2B, or FIG. 4, is a code, i.e., a sequence of quaternary codewords, each of length l, for each input set of data symbols. In embodiments in which the original data is decompressed into multiple subbands prior to the mapping process, a unique header is added to each code, which unique header designates the position of the code (and its respective input set of data) within the initial data sequence. For example, after the mapping process, the obtained quaternary sequence may be cut into short quaternary sequences, each called "code." Each code comprises a header and a payload. The payload contains the encoded input set of data. The header is added to its respective payload during the cutting process, and the header is independent from the input set of data. The header identifies the position of the payload in the DNA sequence to be synthesized based on the relative position of the respective input data set, encoded in the payload, in the initial input data sequence. If, in the method of encoding the data, the original data was decomposed into multiple subbands, the header also contains a part that identifies the subband to which the payload belongs. For example, the header or part of the header may be encoded using the codewords of codebook C* that was used to obtain the payload. In other embodiments, for example, the header or part of the header may be encoded using predefined codes of A, T, C, G that are known to the decoder and that are not part of the codebook C*. It should be noted that the total length of the code is equal to the length of the header plus the length of the payload, and it is this total length that is a "short" quaternary sequence. The codes are then transformed into synthetic DNA by synthesizing the codes into a DNA sequence in the order indicated by the headers. Accordingly, the encoding techniques result in a set of short quaternary sequences of A, T, C, and G containing the encoded data with each quaternary sequence including, as a header thereof, an indication of relative positioning in the synthetic DNA to be synthesized.

To synthesize the DNA to store the encoded data, in the form of the ordered quaternary sequences, the quaternary sequences may be grown, e.g., using solid-phase synthesis comprising, for example, a phosphoramidite method, as a oligonucleotide chain, exhibiting nucleotides A, C, T, and G according to the sequences defined by the code, and assembled in the order indicated by the headers, to form a synthetic DNA sequence (e.g., strand) comprising the ordered combination of quaternary sequences. Other methods for forming (e.g., growing) synthetic DNA with a predetermined sequence of nucleotides are described in, e.g., Hughes et al., "Synthetic DNA Synthesis and Assembly: Putting the Synthetic in Synthetic Biology," *Cold Spring Harbor perspectives in biology* 9, No. 1 (2017): a023812 (pages 1 to 17), the entire disclosure of which is incorporated herein by this reference.

Due to the encoding techniques used in the disclosed methods, synthesis errors may be avoided or at least minimized. For example, because the encoding techniques avoid consecutive occurrences of the same nucleotides in the codewords used to form the code (i.e., the sequence of quaternary codewords of A, T, C, and G that represent the set of input data); ensure a greater percentage of A and T, than that of G and C, in the oligos; and avoid repeated patterns of codewords throughout the code, errors during the synthesis to form the physical synthetic DNA strands may be avoided or at least minimized.

Due to the encoding techniques utilized in the method, the resulting synthetic DNA strands do not include multiple, consecutive occurrences of the same nucleotides. That is, given the constraints of the dictionaries $C_1$ and $C_2$ used to form the codewords $c_i$ of the codebook(s) C*, none of A, T, C, and G will be consecutively repeated, anywhere in the DNA strand, more than two times. That is, the synthetic DNA strand may include a quaternary sequence of ATTAC (with T consecutively repeated only twice), but will not include a quaternary sequence of ATTTC because dictionary $C_1$ excluded pairs, such as TT. Moreover, due to the constraints of the dictionaries $C_1$ and $C_2$ as having a greater percentage of G and C than of A and T in the dictionaries $C_1$ and $C_2$ (because the dictionary $C_1$ comprising the pairs of nucleotides does not include the pairs GC and CG), the percentage of G and C in the oligos of the synthetic DNA strand, and of the synthetic DNA strand overall, is less than or equal to the percentage of A and T in the oligos of the synthetic DNA strand, and of the synthetic DNA strand overall. Also, because of the encoding techniques used in the methods of the disclosure, the resulting synthetic DNA strands do not include a repeated pattern of any codewords.

Later, perhaps many years later, the synthetic DNA sequence may be decoded (e.g., read) to reconstruct the original digital data, by reverse use of the codebook C* with its already-determined codewords $c_i$ of length 1 and there already defined associations to the original symbols $s_i$ of input data set $\Sigma$. For example, for a DNA sequence that includes, at the start, the nucleotide sequence {ACTAGAGTACTC} and knowing that each codeword used was of length 4, then the first codeword $c_1$ to be decoded is {ACTA}, the second codeword $c_2$ to be decoded is {GAGT}, and the third codeword $c_3$ to be decoded is {ACTC}. Because the codebook C* was constructed, according to the methods of this disclosure, to include all unique codewords, each of the codewords $c_1$, $c_2$, and $c_3$ is decodable as a particular one of the symbols $s_i$ of the input data set $\Sigma$. Notably, in embodiments in which the DNA sequence was encoded using a replication phase, one or more of $c_1$, $c_2$, and $c_3$ may turn out to decode as the same symbol (e.g., $s_1$) of the input data set $\Sigma$. Thus, the original data can be decoded and reassembled, i.e., read, from the synthetic DNA sequence, enabling the synthetic DNA sequence to function as a high-capacity, durable, long-term data storage medium. That is, although artificial, the synthetic DNA encoded with the data shares some of the same properties as naturally-occurring DNA molecules. For example, the synthetic DNA allows the storage of a huge amount of information in a tiny volume with no loss of information for hundreds of years.

In implementing the methods disclosed, it should be recognized that the symbols $s_i$ of the input data set $\Sigma$ may or may not be binary symbols (e.g., 0 or 1). For example, in some embodiments, the symbols $s_i$ may include or consist of a vector of integer numbers (e.g., $s_i$={integer a, integer b, integer c}, such as $s_1$={4, 3, 9}). In other embodiments, the symbols $s_i$ may include or consist of real numbers other than or in addition to integers (e.g., $s_1$=2/3, $s_2$=5/3, . . . ). In still other embodiments, the symbols $s_i$ may include or consist of vectors of real numbers (e.g., s1={0, 1; 1/3; 6}. Thus, the methods are not restricted to encoding binary data.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method for encoding digital data in synthetic deoxyribonucleic acid (DNA) sequences, the method comprising:
for an input data sequence comprising a set of symbols, constructing a codebook of codewords, comprising:
constructing a number of unique codewords of a nucleotide length, comprising:
wherein constructing each of the codewords comprises:
for an even nucleotide length, forming the codeword from a selection of nucleotide pairs from a first predefined dictionary of nucleotide pairs; and
for an odd nucleotide length, forming the codeword from the selection of nucleotide pairs from the first predefined dictionary of nucleotide pairs and from an additional selection of a nucleotide from a second predefined dictionary of individual nucleotides,
wherein the number of unique codewords of the codebook is greater than a number of symbols of the set of symbols from the input data sequence;
for each symbol of the set of symbols from the input data sequence, designating at least one codeword, of the codebook, as associable with that symbol, the designating comprising, for at least one symbol of the set of symbols from the input data sequence, designating more than one codeword, of the codebook, as associable with that at least one symbol;
for the each symbol of the set of symbols from the input data sequence, coding the each symbol as one codeword, selected from the designated at least one codeword associable with that symbol;
forming a code from the one codewords, the code comprising the one codewords arranged in an order corresponding to an order, of their respective symbols of the set of symbols, in the input data sequence; and
synthesizing a synthetic DNA sequence with nucleotides ordered to match the code.

2. The method of claim 1, wherein, in constructing the each of the codewords, a percentage of G and C nucleotides in the first predefined dictionary of nucleotide pairs is less than a percentage of A and T nucleotides in the first predefined dictionary of nucleotide pairs.

3. The method of claim 1, wherein, in constructing the each of the codewords, the first predefined dictionary of nucleotide pairs does not comprise any pairs of the same nucleotide.

4. The method of claim 3, wherein, in constructing the each of the codewords, the first predefined dictionary of nucleotide pairs further does not comprise a GC nucleotide pair and does not comprise a CG nucleotide pair.

5. The method of claim 1, wherein designating the at least one codeword, of the codebook, as associable with that symbol comprises:
for a first symbol, of the set of symbols, occurring in the input data sequence less frequently than a second symbol, of the set of symbols, occurs in the input data sequence, designating only a first number of codewords, of the codebook, as associable with that first symbol; and
for the second symbol, of the set of symbols, occurring in the input data sequence more frequently than the first symbol occurs in the input data sequence, designating a second number of codewords, of the codebook, as associable with the second symbol, the second number being greater than the first number, and the first number being equal to or greater than one.

6. The method of claim 1, wherein, for the each symbol of the set of symbols from the input data sequence, designating the at least one codeword, of the codebook, as associable with that symbol comprises designating at least two codewords, of the codebook, as associable with that symbol.

7. The method of claim 1, wherein coding the each symbol as one codeword, selected from the designated at least one codeword associable with that symbol, comprises randomly selecting the one codeword from the at least one codeword associable with that symbol.

8. The method of claim 1, further comprising forming the input data sequence as a subband of an initial digital data sequence, comprising decomposing the initial digital data sequence into a number of the subbands.

9. The method of claim 8, wherein each of the designating, coding, and forming of the code acts are independently carried out for each of the subbands.

10. The method of claim 1, further comprising, after forming the code from the one codewords, reviewing the code to identify any codewords thereof in a position, in the order, that does not correspond to a position, of its associable symbol, in the input data sequence.

11. A method for encoding digital data in synthetic deoxyribonucleic acid (DNA) sequences, the method comprising:
for an input data sequence comprising a set of symbols, constructing a codebook of codewords, comprising:
constructing a number of unique codewords of a nucleotide length, comprising:
wherein constructing each of the codewords comprises:
for an even nucleotide length, forming the codeword from a selection of nucleotide pairs from a first predefined dictionary of nucleotide pairs having a greater percentage of A and T in the first predefined dictionary than a percentage of G and C in the first predefined dictionary; and
for an odd nucleotide length, forming the codeword from the selection of nucleotide pairs from the first predefined dictionary of nucleotide pairs and from an additional selection of a nucleotide from a second predefined dictionary of individual nucleotides;
for each symbol of the set of symbols from the input data sequence, designating at least one codeword, of the codebook, as associable with that symbol;
for the each symbol of the set of symbols from the input data sequence, coding the each symbol as one codeword, selected from the designated at least one codeword associable with that symbol;
forming a code from the one codewords, the code comprising the one codewords arranged in an order corresponding to an order, of their respective symbols of the set of symbols, in the input data sequence; and
synthesizing a synthetic DNA sequence with nucleotides ordered to match the code.

12. The method of claim 11, wherein, in constructing the codebook of codewords, the number of unique codewords of the codebook is greater than a number of symbols of the set of symbols from the input data sequence.

13. The method of claim 12, wherein, in constructing the codebook of codewords, the number of unique codewords of the codebook is at least twice the number of symbols of the set of symbols from the input data sequence.

14. The method of claim 12, wherein, in constructing the codebook of codewords, the number of unique codewords of the codebook is less than twice the number of symbols of the set of symbols from the input data sequence.

15. The method of claim 11, wherein, in constructing the each of the codewords, the first predefined dictionary consists of nucleotide pairs AT, AC, AG, TA, TC, TG, CA, CT, GA, and GT.

16. The method of claim 11, further comprising:
prior to constructing the codebook of codewords, decomposing an initial digital data sequence into subbands, each subband providing one of the input data sequence; and
repeating, for each subband, the constructing of the codebook, the designating, the coding, and the forming of the code.

17. The method of claim 16, wherein synthesizing the synthetic DNA sequence with nucleotides ordered to match the code comprises:
for each of the codes formed from repeating the forming of the code for each subband, synthesizing a synthetic DNA portion; and
forming the synthetic DNA sequence from the synthetic DNA portions ordered to match an order of respective subbands from the initial digital data sequence.

18. A method for encoding digital data in synthetic deoxyribonucleic acid (DNA) sequences, the method comprising:
for an input data sequence comprising a set of symbols, constructing a codebook of codewords, comprising:
constructing a number of unique codewords of a nucleotide length, comprising:
wherein constructing each of the codewords comprises:
for an even nucleotide length, forming the codeword from a selection of nucleotide pairs from a first predefined dictionary of nucleotide pairs; and
for an odd nucleotide length, forming the codeword from the selection of nucleotide pairs from the first predefined dictionary of nucleotide pairs and from an additional selection of a nucleotide from a second predefined dictionary of individual nucleotides;
for each symbol of the set of symbols from the input data sequence, designating at least one codeword, of the codebook, as associable with that symbol;
for the each symbol of the set of symbols from the input data sequence, coding the each symbol as one codeword, selected from the designated at least one codeword associable with that symbol;
forming a code from the one codewords, the code comprising the one codewords arranged in an order corresponding to an order, of their respective symbols of the set of symbols, in the input data sequence; and
synthesizing a synthetic DNA sequence with nucleotides ordered to match the code.

19. The method of claim 18, wherein, in constructing the number of unique codewords of the nucleotide length, the nucleotide length is predefined.

* * * * *

UNITED STATES PATENT AND TRADEMARK OFFICE
CERTIFICATE OF CORRECTION

PATENT NO. : 10,917,109 B1
APPLICATION NO. : 16/811985
DATED : February 9, 2021
INVENTOR(S) : Melpomeni Panagiota Dimopoulou and Marc Antonini It is certified that error appears in the above-identified patent and that said Letters Patent is hereby corrected as shown below:

In the Specification

| | | |
|---|---|---|
| Column 1, | Line 22, | change "may be ever." to --maybe ever.-- |
| Column 3, | Line 8, | change "data-whether" to --data—whether-- |
| Column 3, | Line 9, | change "non-binary-into" to --non-binary—into-- |
| Column 8, | Lines 21-23, | change "*iseven*" to --iseven-- and delete "]" |
| Column 9, | Line 19, | change "$s_1$" to --$s_i$-- |
| Column 9, | Line 24, | change "$C_5$," to --$c_5$,-- |
| Column 9, | Line 55, | change "consist of." to --consist of:-- |
| Column 10, | Line 5, | change "rand" to --*rand*-- |
| Column 10, | Line 38, | delete "+1" at the end of the equation |
| Column 10, | Line 42, | delete "+1" at the end of the equation |
| Column 10, | Line 54, | change "m [L/k];" to --m=[L/k];-- |
| Column 10, | Line 55, | change "symbol s;" to --symbol $s_i$-- |
| Column 10, | Line 58, | change "symbol s;" to --symbol $s_i$-- |
| Column 10, | Line 63, | change "rand" to --*rand*-- |
| Column 12, | Line 41, | change "symbol s" to --symbol s1-- |
| Column 12, | Line 46, | change "s}," to --s1},-- |
| Column 12, | Line 48, | change "c11}." to --c1}.-- |
| Column 12, | Line 54, | change "could-" to --could— -- |
| Column 13, | Line 42, | change "(E)." to --(Σ).-- |
| Column 14, | Line 1, | change "wherein." to --wherein:-- |
| Column 14, | Line 3, | change "subband." to --subband j.-- |
| Column 14, | Lines 43-46, | change "[" to --{-- and delete "]" |
| Column 15, | Line 55, | change "rand" to --*rand*-- |
| Column 17, | Line 18, | change "symbols s;" to --symbols $s_i$-- |
| Column 17, | Line 43, | change "symbols s;" to --symbols $s_i$-- |

Signed and Sealed this
Eighteenth Day of May, 2021

Drew Hirshfeld
*Performing the Functions and Duties of the
Under Secretary of Commerce for Intellectual Property and
Director of the United States Patent and Trademark Office*